(12) United States Patent
Kawaoka

(10) Patent No.: US 6,630,861 B2
(45) Date of Patent: Oct. 7, 2003

(54) VARIABLE GAIN AMPLIFIER

(75) Inventor: Yoshizumi Kawaoka, Kusatsu (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 09/962,179

(22) Filed: Sep. 25, 2001

(65) Prior Publication Data

US 2002/0050857 A1 May 2, 2002

(30) Foreign Application Priority Data

Oct. 31, 2000 (JP) ........................................ 2000-332568

(51) Int. Cl.[7] ................................................. H03G 5/16
(52) U.S. Cl. ...................... 330/133; 330/134; 330/285; 330/302; 330/310
(58) Field of Search ................................. 330/133, 134, 330/285, 302, 310

(56) References Cited

U.S. PATENT DOCUMENTS

| | | | | |
|---|---|---|---|---|
| 4,559,503 A | * | 12/1985 | Camand et al. .............. 330/302 |
| 4,763,081 A | * | 8/1988 | Jason .......................... 330/149 |
| 5,047,731 A | * | 9/1991 | Lee .............................. 330/282 |
| 5,051,705 A | * | 9/1991 | Moghe et al. ............... 330/277 |
| 5,371,477 A | * | 12/1994 | Ikeda et al. .................. 330/282 |
| 5,509,078 A | * | 4/1996 | Hiraoka et al. ................ 381/1 |
| 5,986,503 A | * | 11/1999 | Ichikawa ..................... 330/277 |

* cited by examiner

*Primary Examiner*—Michael Tokar
*Assistant Examiner*—Linh V Nguyen
(74) *Attorney, Agent, or Firm*—Keating & Bennett, LLP

(57) ABSTRACT

A variable gain amplifier includes at least two amplifiers for amplifying a signal, the at least two amplifiers being connected in series with one another, and a variable resistor having a resistance that is controlled in accordance with a voltage applied to a control terminal, the variable resistor being connected between the outputs of two of the at least two amplifiers having opposite output phases. As a result, the variable gain amplifier is capable of a low-gain operation and an attenuating operation in a high-frequency amplifier used in a communications device for transmitting and receiving high-frequency signals.

20 Claims, 6 Drawing Sheets

VARIABLE GAIN AMPLIFIER

BACKGROUND OF THE INVENTION

1. Field of the Invention

The present invention relates to variable gain amplifiers, and more specifically, the present invention relates to a high-frequency variable gain amplifier, preferably for use in a communications device for transmitting and receiving high-frequency signals, which is capable of a low-gain operation and an attenuating operation.

2. Description of the Related Art

A receiver circuit for wireless communications involves a considerably wide range of reception levels. For this reason, a level control is required in a radio frequency band amplification unit at a location upstream of a reception mixer. Meanwhile, in a transmitter circuit, an adjustment of the transmission power level is required in order to reduce distortions on the receiving end and to control the transmission power level in accordance with the distance to the receiver. The amplification and attenuation operations in accordance with the level of an input signal and the adjustment of the transmission power level have been achieved by a variable gain amplifier primarily composed of an amplifier and a variable resistor.

FIG. 5 shows an example of such a variable gain amplifier. As shown in FIG. 5, in the variable gain amplifier, between an input terminal 71 to which a high-frequency signal is applied and an output terminal 72 from which a high-frequency signal is output, a common-source FET 73 is provided as an amplifier. The gate of the FET 73 is connected to the input terminal 71 via a capacitor 75, and the drain of the FET 73 is connected to the output terminal 72 via a capacitor 76. Furthermore, the drain of the FET 73 is connected to a drain power supply terminal 77 via an inductor 80 so that a voltage is applied from the drain power supply terminal 77 to the drain of the FET 73. The gate of the FET 73 is connected to a gate power supply terminal 78 via a resistor 81 so that a voltage is applied from the gate power supply terminal 78 to the gate of the FET 73.

Furthermore, between the drain and the gate of the FET 73, a FET 74 is provided as a variable resistor which negatively feeds back output from the drain of the FET 73 to the gate of the FET 73. The drain of the FET 74 is connected to the drain of the FET 73, and the source of the FET 74 is connected to the gate of the FET 73 via a capacitor 83. The capacitor 83 is provided in order to separate DC voltage between the drain and the gate of the FET 73. Furthermore, between the source and the drain of the FET 74, a resistor 84 is provided so that the source voltage and the gate voltage of the FET 74 will be substantially the same. Furthermore, the gate of the FET 74 is connected to a control terminal 79 via a resistor 82 so that a voltage is applied from the control terminal to the gate of the FET 74 via the resistor 82.

When the voltage applied to the control terminal 79 is changed, the gate voltage of the FET 74 changes accordingly, and in accordance therewith, the resistance between the source and the drain of the FET 74 changes, such that the FET 74 functions as a variable resistor. When the gate voltage of the FET 74 increases, the resistance between the source and the drain of the FET 74 decreases. As a result, the amount of negative feedback from the drain of the FET 73 to the gate of the FET 73 increases, decreasing the gain of the FET 73. On the other hand, when the gate voltage of the FET 74 decreases, the resistance between the source and the drain of the FET 74 increases. Consequently, the amount of negative feedback from the drain of the FET 73 to the gate of the FET 73 decreases, increasing the gain of the FET 73. variable gain amplifier.

FIG. 6 shows a multistage variable gain amplifier that is implemented using the variable gain amplifier shown in FIG. 5. In the multistage variable gain amplifier, between an input terminal 71 to which a high-frequency signal is applied and an output terminal 72 to which a high-frequency signal is output, FETs 85 and 91 are provided as amplifiers, upstream and downstream of the variable gain amplifier shown in FIG. 5, respectively.

More specifically, between the input terminal 71 and the output terminal 72, a common-source FET 85 used as an amplifier, the variable gain amplifier shown in FIG. 5, and a common-source FET 91 used as an amplifier are provided. The gate of the FET 85 is connected to the input terminal 71 via a capacitor 86, and the drain of the FET 85 is connected to the capacitor 75 of the variable gain amplifier shown in FIG. 5. The gate of the FET 91 is connected to the capacitor 76 of the variable gain amplifier shown in FIG. 5, and the drain of the FET 91 is connected to the output terminal 72 via a capacitor 92.

Furthermore, the drain of the FET 85 is connected to a drain power supply terminal 87 via an inductor 89 so that a voltage is applied from the drain power supply terminal 87 to the drain of the FET 85. The gate of the FET 85 is connected to a gate power supply terminal 88 via a resistor 90 so that a voltage is applied from the gate power supply terminal 88 to the gate of the FET 85.

Furthermore, the drain of the FET 91 is connected to a drain power supply terminal 93 via an inductor 95 so that a voltage is applied from the drain power supply terminal 93 to the drain of the FET 91. The gate of the FET 91 is connected to a gate power supply terminal 94 via a resistor 96 so that a voltage is applied from the gate power supply terminal 94 to the gate of the FET 91. The variable gain amplifier is thus implemented as a multistage variable gain amplifier.

In the variable gain amplifiers shown in FIGS. 5 and 6, in order to provide the FET 74 used as a variable resistor between the drain and the gate of the FET 73 used as an amplifier, the capacitor 83 is connected in series with the FET 74, separating DC voltage between the drain and the gate of the FET 73.

However, the capacitor 83 has a high impedance in lower frequencies if the capacitance thereof is small, causing limitations on gain control with respect to lower frequencies. Thus, when the variable gain amplifier is implemented in a microwave monolithic integrated circuit (hereinafter abbreviated as MMIC), the capacitor 83 occupies a significantly large area, thereby increasing the size of the MMIC. Furthermore, depending on the capacitance of the capacitor 83, the phase of the feedback is reversed from negative to positive around the cutoff frequency of the capacitor 83, destabilizing the circuit and causing an oscillation.

Furthermore, when the variable gain amplifier is implemented in an MMIC, in order to test whether the FETs in the MMIC have been properly arranged, the drain, the source, and the gate of each of the FETs must be connected to a tester for DC voltage. Thus, if the source of the FET 74 used as a variable resistor is separated from external terminals (gate power supply terminal, drain power supply terminal, etc.) for DC voltage by the capacitor 83, a testing terminal must be provided and connected to the source of the FET 74, thereby further increasing the chip size of the MMIC.

SUMMARY OF THE INVENTION

In order to solve the problems described above, preferred embodiments of the present invention provide a variable gain amplifier in which oscillations around the cutoff frequency of a DC-cutoff capacitor used in a feedback circuit are prevented, and which allows for a much smaller MMIC implementation.

According to a preferred embodiment of the present invention, a variable gain amplifier includes at least two amplifiers for amplifying a signal, the at least two amplifiers being connected in series with one another, and a variable resistor having a resistance that is controlled in accordance with a voltage applied to a control terminal, the variable resistor being connected between the outputs of two of the at least two amplifiers having opposite output phases from each other.

According to another preferred embodiment of the present invention, a variable gain amplifier includes at least two amplifiers for amplifying a signal, the at least two amplifiers being connected in series with one another, and a variable resistor having a resistance that is controlled in accordance with a voltage applied to a control terminal, the variable resistor being connected between the inputs of two of the at least two amplifiers having opposite input phases from each other.

In the variable gain amplifiers according to preferred embodiments of the present invention, the DC-cutoff capacitor connected in series with the source of the FET used as a variable resistor, which has been required in the conventional variable gain amplifiers, is eliminated. Thus, the variable gain amplifiers are free from the drawbacks due to the DC-cutoff capacitor, i.e., oscillations, and limitations on gain control with respect to lower frequencies.

Furthermore, when the variable gain amplifiers according to preferred embodiments of the present invention are implemented in an MMIC, the DC-cutoff capacitor connected to the source of the FET used as a variable resistor, and the resistor for equalizing the source voltage and the drain voltage of the FET used as a variable resistor, which have been required in the conventional variable gain amplifiers, are eliminated. In addition, the testing terminal, also required in the conventional variable gain amplifiers, can also be eliminated by connecting the source of an FET used as the variable resistor to a drain power supply terminal for DC voltage. Accordingly, the size of the MMIC according to preferred embodiments of the present invention is greatly reduced compared with the conventional MMIC.

Other features, elements, characteristics and advantages of the present invention will become more apparent from the detailed description of preferred embodiments below with reference to the attached drawings.

DETAILED DESCRIPTION OF PREFERRED EMBODIMENTS

A variable gain amplifier according to a first preferred embodiment of the present invention will be described below with reference to FIG. 1.

Figure 1:
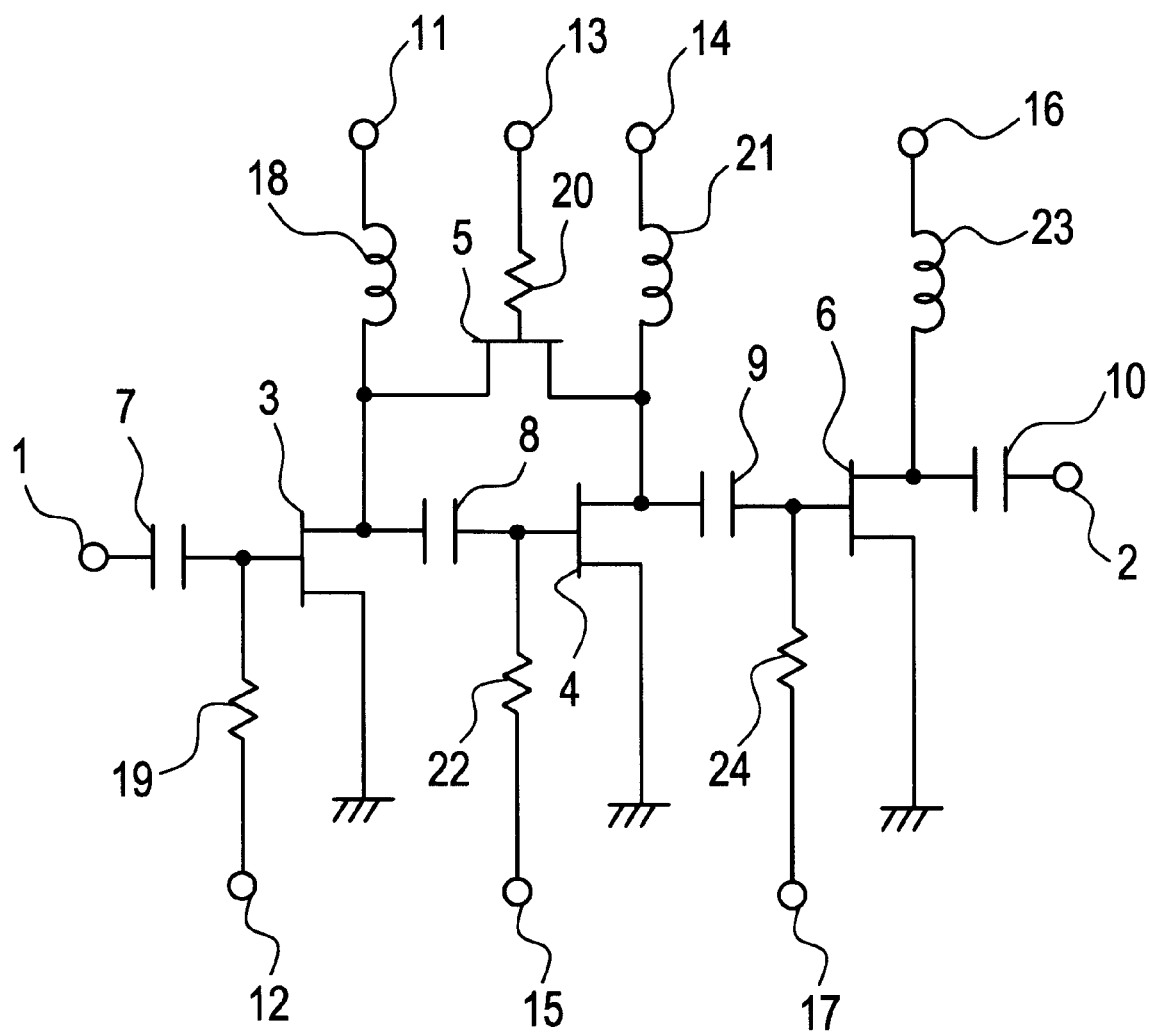
FIG. 1 is a circuit diagram of a variable gain amplifier according to a first preferred embodiment of the present invention.

In the variable gain amplifier shown in FIG. 1, between an input terminal 1 to which a high-frequency signal is applied and an output terminal 2 from which a high-frequency signal is output, common-source FETs 3, 4, and 6 are provided as amplifiers. The gate of the FET 3 is connected to the input terminal 1 via a capacitor 7, the drain of the FET 3 is connected to the gate of the FET 4 via a capacitor 8, the drain of the FET 4 is connected to the gate of the FET 6 via a capacitor 9, and the drain of the FET 6 is connected to the output terminal 2 via a capacitor 10.

Furthermore, the drain of the FET 3 is connected to a drain power supply terminal 11 via an inductor 18 so that a voltage is applied from the drain power supply terminal 11 to the drain of the FET 3. The gate of the FET 3 is connected to a gate power supply terminal 12 via a resistor 19 so that a voltage is applied from the gate power supply terminal 12 to the gate of the FET 3. The drain of the FET 4 is connected to a drain power supply terminal 14 via an inductor 21 so that a voltage is applied from the drain power supply terminal 14 to the drain of the FET 4. The gate of the FET 4 is connected to a gate power supply terminal 15 via a resistor 22 so that a voltage is applied from the gate power supply terminal 15 to the gate of the FET 4. The drain of the FET 6 is connected to a drain power supply terminal 16 via an inductor 23 so that a voltage is applied from the drain power supply terminal 16 to the drain of the FET 6. The gate of the FET 6 is connected to a gate power supply terminal 17 via a resistor 24 so that a voltage is applied from the gate power supply terminal 17 to the gate of the FET 6.

Furthermore, between the drain of the FET 3 and the drain of the FET 4, a FET 5 is provided as a variable resistor which negatively feeds back output from the drain of the FET 4 to the drain of the FET 3. The drain of the FET 5 is connected to the drain of the FET 4, and the source of the FET 5 is connected to the drain of the FET 3. Furthermore, the gate of the FET 5 is connected to a control terminal 13 via a resistor 20 so that a voltage is applied from the control terminal 13 to the gate of the FET 5 via the resistor 20.

When the voltage applied to the control terminal 13 is changed, the gate voltage of the FET 5 changes accordingly, and in accordance therewith, the resistance between the source and the drain of the FET 5 changes, with the FET 5 thus functioning as a variable resistor. When the gate voltage of the FET 5 increases, the resistance between the source and the drain of the FET 5 decreases. As a result, the amount of negative feedback from the drain of the FET 4 to the drain of the FET 3 increases, thereby decreasing the combined gain of the FET 3 and the FET 4. On the other hand, when the gate voltage of the FET 5 decreases, the resistance between the source and the drain of the FET 5 increases. As a result, the amount of negative feedback from the drain of the FET 4 to the drain of the FET 3 decreases, increasing the combined gain of the FET 3 and the FET 4. The variable gain amplifier is thus implemented as a three-stage variable gain amplifier.

In the three-stage variable gain amplifier according to the present preferred embodiment of the present invention, the DC-cutoff capacitor connected in series with the source of the FET used as a variable resistor, which has been required in the conventional variable gain amplifiers, is eliminated. Thus, the three-stage variable gain amplifier is free from the drawbacks due to the DC-cutoff capacitor, i.e., oscillations, and limitations on gain control with respect to lower frequencies.

Furthermore, when the three-stage variable gain amplifier is implemented in an MMIC, the DC-cutoff capacitor connected to the source of the FET used as a variable resistor, and the resistor for equalizing the source voltage and the drain voltage of the FET used as a variable resistor, which have been required in the conventional variable gain amplifiers, are eliminated. In addition, the testing terminal, also required in the conventional variable gain amplifiers, can also be eliminated because the source of the FET 5 used as a variable resistor is connected to the drain power supply terminal 11 for DC voltage. Accordingly, the size of the MMIC according to other preferred embodiments of the present invention is greatly reduced compared with the conventional MMIC.

Although the arrangement is such in the first preferred embodiment that the FET 5 used as a variable resistor is preferably connected between the drain of the FET 3 and the drain of the FET 4 having the opposite output phases from each other, other arrangements are possible as long as a variable resistor is connected between the drains of two FETs having the opposite output phases from each other. For example, the FET 5 may be connected between the drain of the FET 4 and the drain of the FET 6. Furthermore, since the FET 5 is used as a variable resistor, the FET 5 may be connected with the drain and the source thereof being reversed.

Furthermore, although the variable gain amplifier according to the first preferred embodiment has been described as a three-stage variable gain amplifier, the variable gain amplifier may be implemented with two amplification stages, or four or more amplification stages, and the variable range of gain can be increased by connecting the outputs of non-adjacent FETs having the opposite output phases from each other.

A variable gain amplifier according to a second preferred embodiment of the present invention will be described below with reference to FIG. 2.

Figure 2:
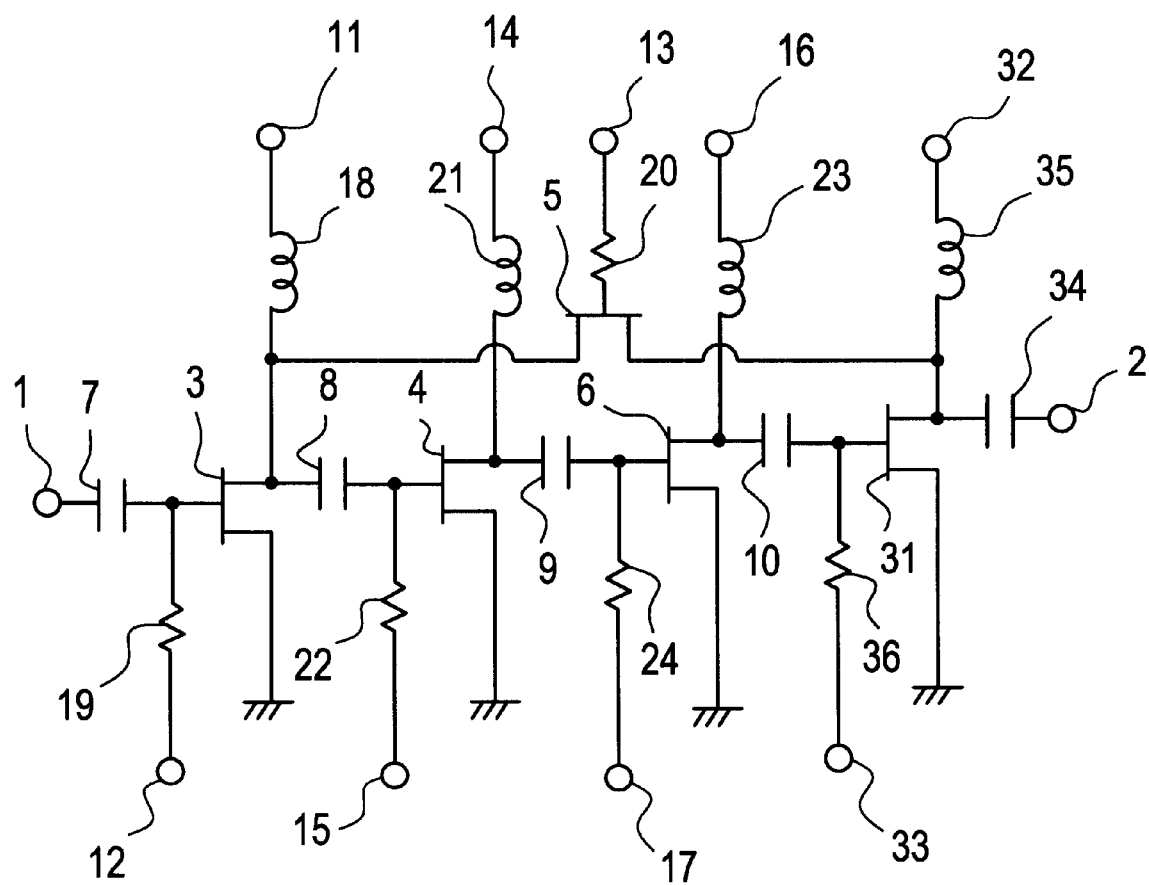
FIG. 2 is a circuit diagram of a variable gain amplifier according to a second preferred embodiment of the present invention.

The variable gain amplifier according to the second preferred embodiment, shown in FIG. 2, is implemented as a four-stage variable gain amplifier by connecting a common-source FET 31, used as an amplifier, to the three-stage variable gain amplifier according to the first preferred embodiment. In the four-stage variable gain amplifier, between an input terminal 1 to which a high-frequency signal is applied and an output terminal 2 from which a high-frequency signal is output, common-source FETs 3, 4, 6, and 31 are provided as amplifiers. The gate of the FET 3 is connected to the input terminal 1 via a capacitor 7, the drain of the FET 3 is connected to the gate of the FET 4 via a capacitor 8, the drain of the FET 4 is connected to the gate of the FET 6 via a capacitor 9, the drain of the FET 6 is connected to the gate of the FET 31 via a capacitor 10, and the drain of the FET 31 is connected to the output terminal 2 via a capacitor 34.

Furthermore, the drain of the FET 31 is connected to a drain power supply terminal 32 via an inductor 35 so that a voltage is applied from the drain power supply terminal 32 to the drain of the FET 31. The gate of the FET 31 is connected to a gate power supply terminal 33 via a resistor 36 so that a voltage is applied from the gate power supply terminal 33 to the gate of the FET 31. The voltages applied to the drains and the gates of the FETs 3, 4, and 6 are the same as in the variable gain amplifier shown in FIG. 1.

Furthermore, between the drain of the FET 3 and the drain of the FET 31, a FET 5 is provided as a variable resistor that negatively feeds back output from the drain of the FET 31 to the drain of the FET 3. The drain of the FET 5 is connected to the drain of the FET 31, and the source of the FET 5 is connected to the drain of the FET 3. The gate of the FET 5 is connected to a control terminal 13 via a resistor 20 so that a voltage is applied from the control terminal 13 to the gate of the FET 5 via the resistor 20.

When the gate voltage of the FET 5 increases, the resistance between the source and the drain of the FET 5 decreases. As a result, the amount of negative feedback from the drain of the FET 31 to the drain of the FET 3 increases, decreasing the combined gain of the FET 3 to the FET 31. When the gate voltage of the FET 5 decreases, the resistance between the source and the drain of the FET increases. Consequently, the amount of negative feedback from the drain of the FET 31 to the drain of the FET 3 decreases, increasing the combined gain of the FET 3 to the FET 31. The variable gain amplifier is thus implemented as a four-stage variable gain amplifier.

In a variable gain amplifier with an even number of amplification stages, such as the one described above, the amplifier in the first stage (the FET 3) and the amplifier in the final stage (FET 31) have opposite output phases from each other, allowing variation of the combined gain of the amplifiers from the first stage to the final stage. Accordingly, even if the number of stages is smaller than the variable gain amplifier according to the first preferred embodiment, a larger variable range of gain can be provided. Obviously, the advantages of the first preferred embodiment are also achieved by the second preferred embodiment.

When a smaller variable range of gain suffices, such a variable range can be provided by connecting a variable resistor between the outputs of adjacent FETs having the opposite output phases from each other, similarly to the first preferred embodiment.

Figure 3:
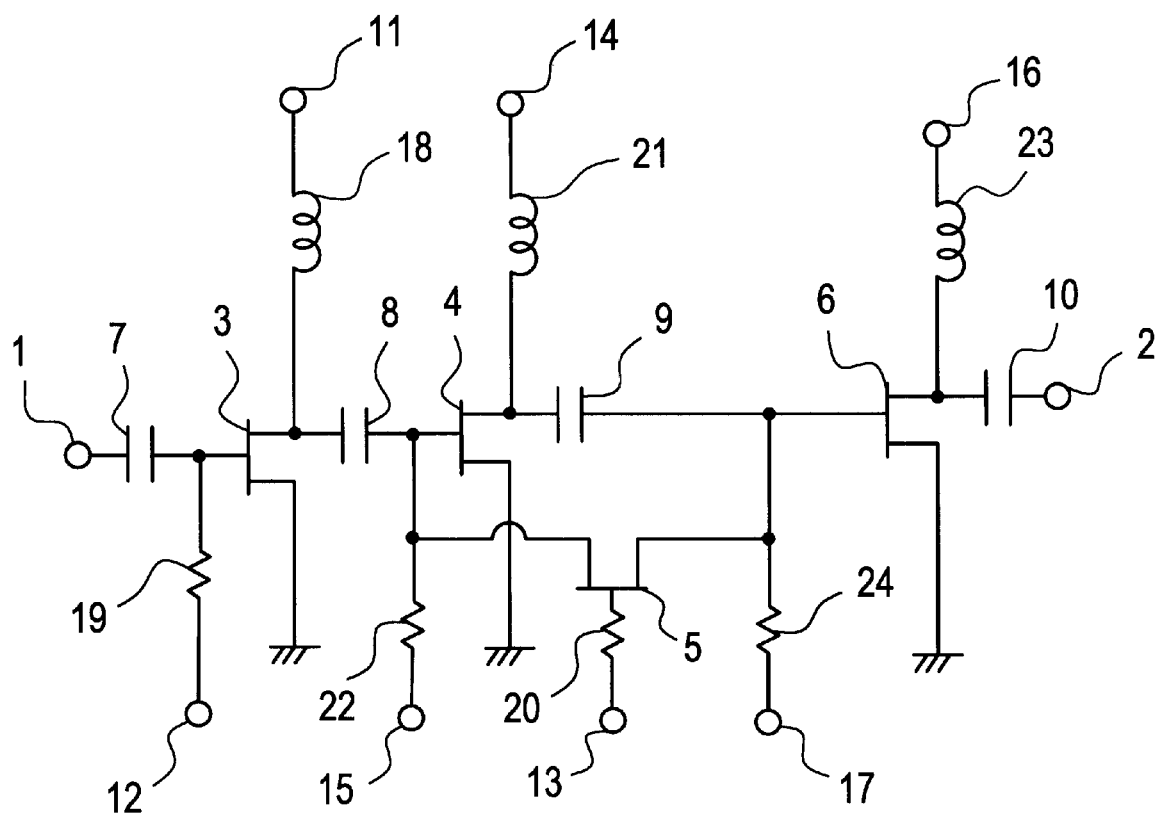
FIG. 3 is a circuit diagram of a variable gain amplifier according to a third preferred embodiment of the present invention.

A variable gain amplifier according to a third preferred embodiment of the present invention will be described below with reference to FIG. 3.

The variable gain amplifier according to the third preferred embodiment differs from the three-stage variable gain amplifier according to the first preferred embodiment only with respect to the point at which the FET 5 used as a variable resistor is connected.

More specifically, between the gate of the FET 4 and the gate of the FET 6, the FET 5 is provided as a variable resistor that negatively feeds back a portion of input to the gate of the FET 6 to the gate of the FET 4. The drain of the FET 5 is connected to the gate of the FET 6, and the source of the FET 5 is connected to the gate of the FET 4. Furthermore, the gate of the FET 5 is connected to the control terminal 13 via the resistor 20 so that a voltage is applied from the control terminal 13 to the gate of the FET 5 via the resistor 20. The variable gain amplifier according to the third preferred embodiment is equally advantageous as the variable gain amplifier according to the first preferred embodiment.

Although the arrangement is such in the third preferred embodiment that the FET 5 used as a variable resistor is connected between the gate of the FET 4 and the gate of the FET 6 having the opposite input phases from each other, other arrangements are possible as long as a variable resistor is connected between the gates of two FETs having the opposite input phases from each other. For example, the FET 5 may be connected between the gate of the FET 3 and the gate of the FET 4. Similarly, in the variable gain amplifier according to the second preferred embodiment, having an even number of amplification stages, the variable resistor may be connected between the inputs, not between the outputs, of the amplifiers in the first stage and the last stage having the opposite input phases from each other, which is equally advantageous as the variable gain amplifier according to the second preferred embodiment.

A variable gain amplifier according to a fourth preferred embodiment of the present invention will be described below with reference to FIG. 4.

Figure 4:
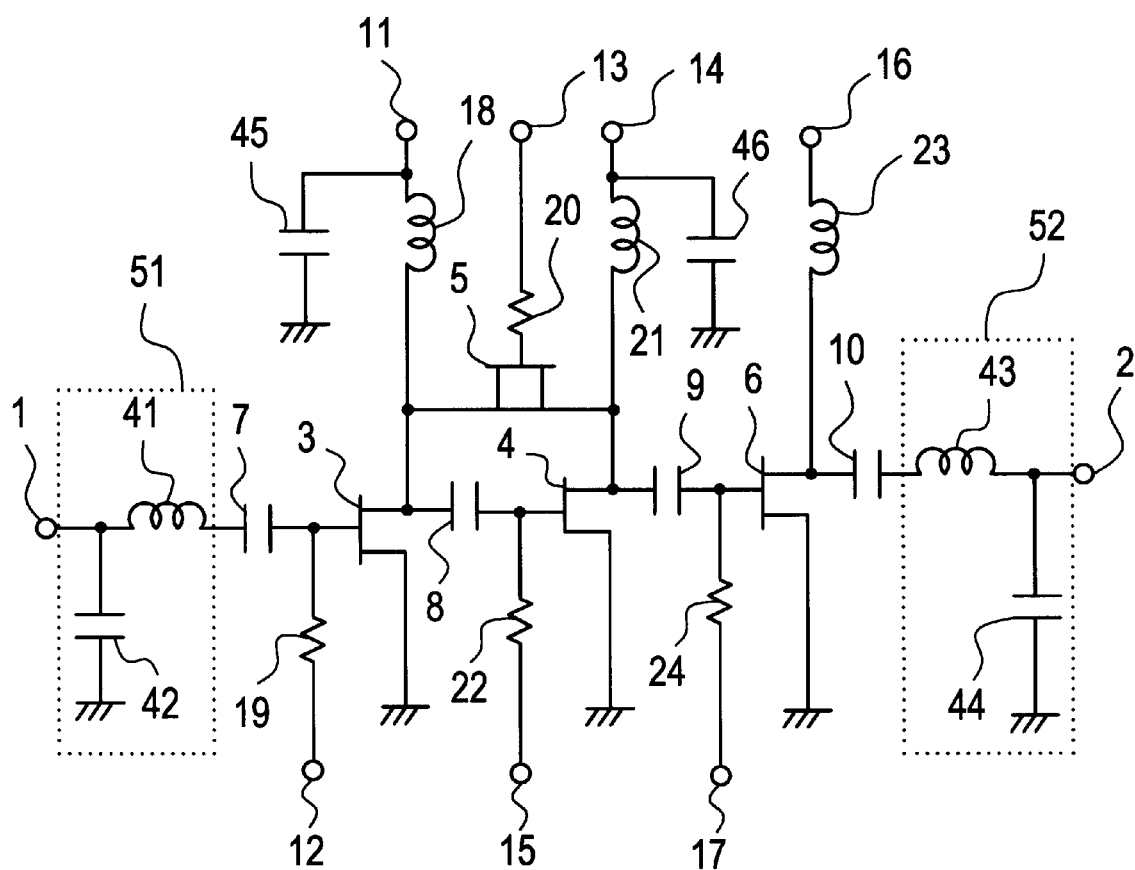
FIG. 4 is a circuit diagram of a variable gain amplifier according to a fourth preferred embodiment of the present invention.
Figure 5:
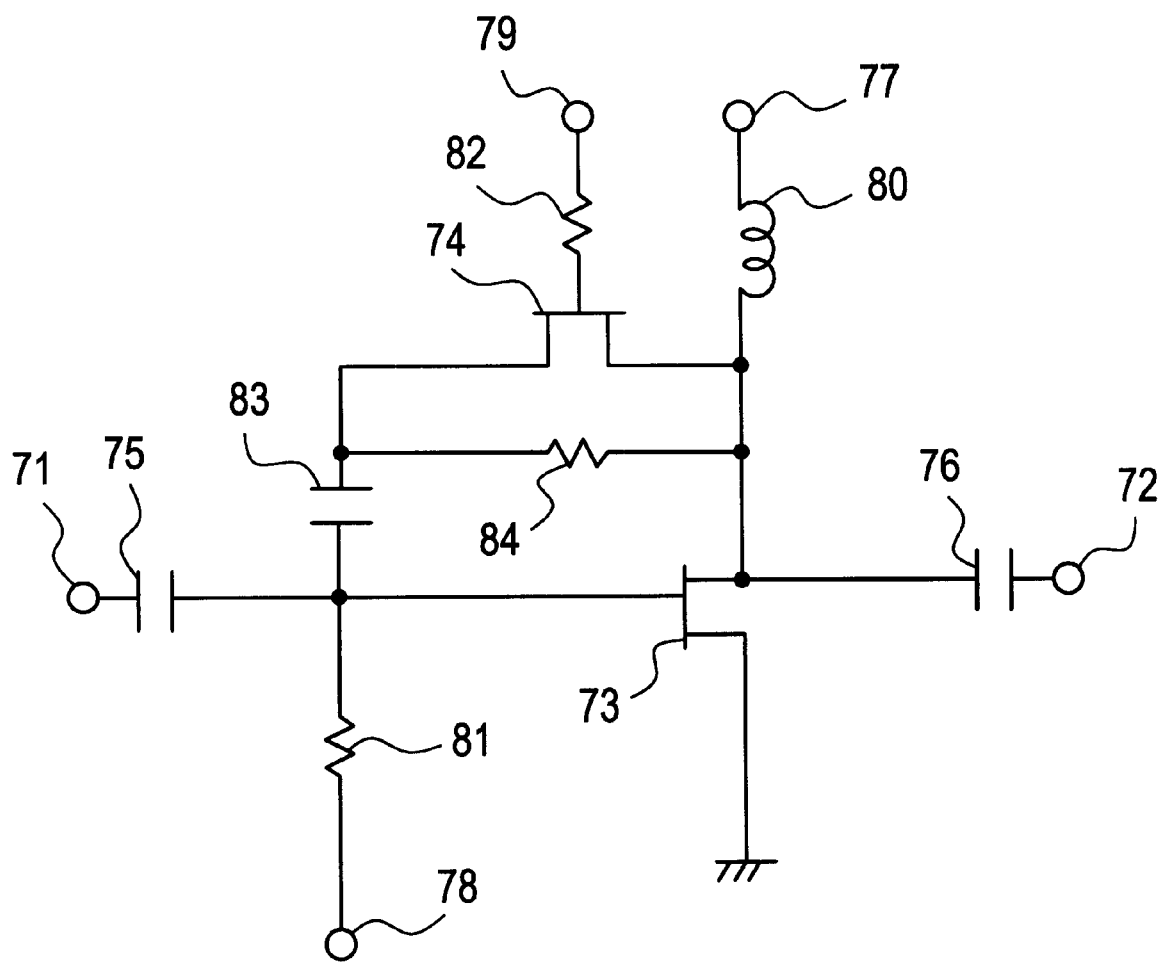
FIG. 5 is a circuit diagram of a conventional single-stage variable gain amplifier.
Figure 6:
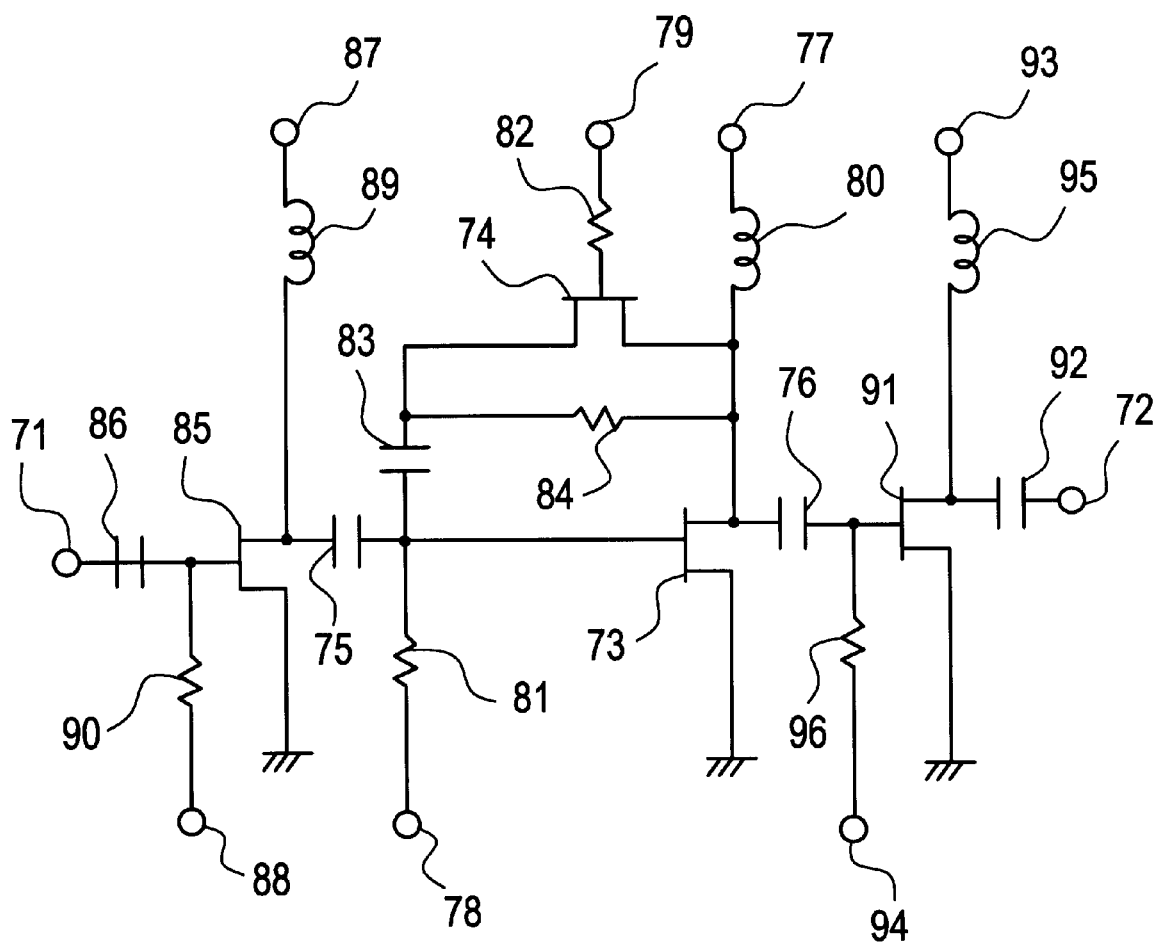
FIG. 6 is a circuit diagram of a conventional multistage variable gain amplifier.

Referring to FIG. 4, the variable gain amplifier according to the fourth preferred embodiment includes an input matching unit 51 and an output matching unit 52, and matching capacitors 45 and 46 for improving gain, in addition to the three-stage variable gain amplifier according to the first preferred embodiment.

Between the input terminal 1 and the three-stage variable gain amplifier shown in FIG. 1, the input matching unit 51 including an inductor 41 and a capacitor 42 is connected. One end of the inductor 41 is connected to the input terminal 1, and the other end thereof is connected to the capacitor 7 of the variable gain amplifier shown in FIG. 1. One end of the capacitor 42 is connected to the input terminal 1, and the other end thereof is connected to the ground. Thus, the input matching unit 51 matches the impedance on the side of the input terminal 1 to which the variable gain amplifier is connected and the input impedance of the variable gain amplifier.

Furthermore, between the output terminal 2 and the three-stage variable gain amplifier shown in FIG. 1, the output matching unit 52 including an inductor 43 and a capacitor 44 is connected. One end of the inductor 43 is connected to the output terminal 2, and the other end thereof is connected to the capacitor 10 of the variable gain amplifier shown in FIG. 1. One end of the capacitor 44 is connected to the output terminal 2, and the other end thereof is connected to the ground. Thus, the output matching unit 52 matches the impedance on the side of the output terminal to which the variable gain amplifier is connected and the output impedance of the variable gain amplifier.

Furthermore, one end of the matching capacitor 45 is connected to the drain power supply terminal 11, and the other end thereof is connected to the ground. The matching capacitor 45 defines a matching circuit in association with the inductor 18 connected between the drain of the FET 3 and the drain power supply terminal 11, increasing the gain of the FET 3 in a desired frequency band.

Furthermore, one end of the matching capacitor 46 is connected to the drain power supply terminal 14, and the other end thereof is connected to the ground. The matching capacitor 46 defines a matching circuit in association with the inductor 21 connected between the drain of the FET 4 and the drain power supply terminal 14, increasing the gain of the FET 4 in a desired frequency band.

Obviously, it is equally advantageous as the fourth preferred embodiment to add an input matching unit, an output matching unit, and matching capacitors to the variable gain amplifiers according to the second and the third preferred embodiments.

Although the amplifiers are implemented by FETs in the above-described preferred embodiments, alternatively, other types of amplifiers such as transistors may be used, and also, variable resistors other than FETs may be used. Furthermore, when a variable gain amplifier according to various preferred embodiments of the present invention is implemented in an MMIC, the capacitors may be implemented by MIM capacitors, and the inductors may be implemented by thin-film coils or microstrip lines.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A variable gain amplifier comprising:
   at least two amplifiers for amplifying a signal, the at least two amplifiers being connected in series with one another;
   a variable resistor having a resistance that is controlled in accordance with a voltage applied to a control terminal, said variable resistor being connected between outputs of two of said at least two amplifiers having opposite output phases from each other; and
   a capacitor connected between an output side of a first of said at least two amplifiers and an input side of a second of said at least two amplifiers; wherein
   one end of said variable resistor is connected to a junction of the output side of the first of said at least two amplifiers and the capacitor; and
   the other end of said variable resistor is connected to an output side of the second of said at least two amplifiers.

2. A variable gain amplifier according to claim 1, wherein said at least two amplifiers comprise an even number of amplifiers, and said variable resistor is connected directly between the outputs of the amplifiers in a first stage and in a final stage having the opposite output phases from each other.

3. A variable gain amplifier according to claim 1, further comprising:
   an input matching unit for matching the input impedance of said variable gain amplifier; and
   an output matching unit for matching the output impedance of said variable gain amplifier.

4. A variable gain amplifier according to claim 1, wherein said variable resistor includes a FET.

5. A variable gain amplifier according to claim 1, wherein each of said at least two amplifiers includes a FET.

6. A variable gain amplifier according to claim 1, wherein said variable gain amplifier is implemented in an MMIC.

7. A variable gain amplifier according to claim 1, wherein the variable gain amplifier comprises one of a two-stage variable gain amplifier, a three-stage variable gain amplifier, and a four-stage variable gain amplifier.

8. A variable gain amplifier according to claim 1, wherein said variable resistor includes a first FET and each of said at least two amplifiers includes a second FET and a third FET, respectively, said first FET being connected between a drain of the second FET and a drain of the third FET.

9. A variable gain amplifier according to claim 1, wherein said variable resistor is directly connected between the outputs of two of said at least two amplifiers having opposite output phases from each other.

10. A variable gain amplifier according to claim 1, wherein said variable resistor includes a transistor.

11. A variable gain amplifier comprising:
    at least two amplifiers for amplifying a signal, the at least two amplifiers being connected in series with one another;

a variable resistor having a resistance that is controlled in accordance with a voltage applied to a control terminal, said variable resistor being connected between the inputs of two of said at least two amplifiers having opposite input phases from each other; and a capacitor connected between an output side of a first of said at least two amplifiers and an input side of a second of said at least two amplifiers; wherein one end of the variable resistor is connected to an input side of the first of said at least two amplifiers; and the other end of the variable resistor is connected to a junction of the capacitor and the input side of the second of said at least two amplifiers.

12. A variable gain amplifier according to claim 11, wherein said at least two amplifiers comprise an even number of amplifiers, and said variable resistor is connected directly between the inputs of the amplifiers in a first stage and in a final stage having the opposite input phases from each other.

13. A variable gain amplifier according to claim 11, further comprising:

an input matching unit for matching the input impedance of said variable gain amplifier; and an output matching unit for matching the output impedance of said variable gain amplifier.

14. A variable gain amplifier according to claim 11, wherein said variable resistor includes a FET.

15. A variable gain amplifier according to claim 11, wherein each of said at least two amplifiers includes a FET.

16. A variable gain amplifier according to claim 11, wherein said variable gain amplifier is implemented in an MMIC.

17. A variable gain amplifier according to claim 11, wherein the variable gain amplifier comprises one of a two-stage variable gain amplifier, a three-stage variable gain amplifier, and a four-stage variable gain amplifier.

18. A variable gain amplifier according to claim 11, wherein said variable resistor includes a first FET and each of said at least two amplifiers includes a second FET and a third FET, respectively, said first FET being connected between a drain of the second FET and a drain of the third FET.

19. A variable gain amplifier according to claim 11, wherein said variable resistor is directly connected between the outputs of two of said at least two amplifiers having opposite output phases from each other.

20. A variable gain amplifier according to claim 11, wherein said variable resistor includes a transistor.

* * * * *